(12) United States Patent
Endo (10) Patent No.: US 9,547,052 B2
(45) Date of Patent: Jan. 17, 2017

(54) NMR SPINNER

(71) Applicant: JEOL Resonance Inc., Tokyo (JP)

(72) Inventor: Yuki Endo, Tokyo (JP)

(73) Assignee: JEOL Ltd., Tokyo (JP)

( * ) Notice: Subject to any disclaimer, the term of this patent is extended or adjusted under 35 U.S.C. 154(b) by 601 days.

(21) Appl. No.: 14/048,065

(22) Filed: Oct. 8, 2013

(65) Prior Publication Data

US 2014/0097843 A1    Apr. 10, 2014

(30) Foreign Application Priority Data

Oct. 9, 2012    (JP) .................................. 2012-224314

(51) Int. Cl.
    *G01V 3/00*    (2006.01)
    *G01R 33/30*    (2006.01)

(52) U.S. Cl.
    CPC .................................. *G01R 33/307* (2013.01)

(58) Field of Classification Search
    CPC .................................................... G01R 33/307
    USPC ......................................................... 324/321
    See application file for complete search history.

(56) References Cited

U.S. PATENT DOCUMENTS

| | | | | |
|---|---|---|---|---|
| 4,254,373 A * | 3/1981 | Lippmaa | ............... | G01R 33/307 324/321 |
| 4,940,942 A * | 7/1990 | Bartuska | ................ | G01R 33/31 324/307 |
| 5,202,633 A | 4/1993 | Doty et al. | | |
| 5,333,994 A * | 8/1994 | Doty | .................... | G01R 33/307 415/200 |
| 5,508,615 A * | 4/1996 | Doty | .................... | G01R 33/307 324/318 |
| 5,760,586 A * | 6/1998 | Foerster | ............... | G01R 33/307 324/318 |
| 6,803,764 B2 * | 10/2004 | Hioka | .................. | G01R 33/307 324/318 |
| 6,812,706 B2 * | 11/2004 | Leung | .................. | G01R 33/307 324/318 |
| 7,196,521 B2 * | 3/2007 | Doty | .................... | G01R 33/307 324/321 |
| 2003/0102867 A1 * | 6/2003 | Hioka | .................. | G01R 33/307 324/321 |

(Continued)

FOREIGN PATENT DOCUMENTS

| | | | |
|---|---|---|---|
| JP | 2001141800 A | | 5/2001 |
| JP | 2002181910 A | * | 6/2002 |
| JP | 2003177172 A | | 6/2003 |

Primary Examiner — Susan Lee
(74) Attorney, Agent, or Firm — The Webb Law Firm (57) ABSTRACT

There is disclosed an NMR (nuclear magnetic resonance) spinner having a turbine structure and a rotor whose spinning rate can be increased. A vortical channel (44) is formed around the rotor (12). The vortical channel (44) consists of a chamber (66) and a nozzle array (68) mounted inside the chamber (66). The chamber (66) has a cross-sectional area that decreases in an upstream to downstream direction. The cross-sectional area of each nozzle also decreases in an upstream to downstream direction. Gas is introduced into the chamber (66), creating a rotating flow (76, 78, 80) in the chamber (66). Plural inwardly swirling streams are created from the inside of the rotating flow. The inwardly swirling streams are ejected from the exits of the nozzles. This results in jet streams, which are blown against the impeller of the rotor, spinning the rotor at high speed.

7 Claims, 8 Drawing Sheets

(56) References Cited

U.S. PATENT DOCUMENTS

2005/0162164 A1* 7/2005 Samoson ............... G01R 33/30
324/318
2010/0109666 A1* 5/2010 Armbruster .......... G01R 33/307
324/318

* cited by examiner

NMR SPINNER

BACKGROUND OF THE INVENTION

Field of the Invention

The present invention relates to a sample spinner for use in NMR spectroscopy and, more particularly, to a mechanism for spinning a sample tube holding a solid sample therein at high speed.

Description of Related Art

When a solid sample is investigated by NMR (nuclear magnetic resonance) spectroscopy, a sample tube holding the solid sample therein is spun while tilted at a given angle (magic angle) to the direction of the static magnetic field. The mechanism used for this purpose is a sample spinner. More specifically, the spinner is installed in the head of an NMR probe. The spinner is inserted as a part of an NMR probe in a bore formed in a static magnetic field generator. The spinner has a transmit/receive coil mounted around a sample tube. When the sample tube is being spun at high speed, the transmit/receive coil generates a varying magnetic field, and an NMR signal is detected.

Each of the spinners disclosed in JP-A-2001-141800 and JP-A-2003-177172 consists of a rotor and a stator. The rotor has a sample tube and an impeller (turbine in JP-A-2001-141800) coupled to the tube. The impeller has a plurality of blades subjected to jet streams of gas. The stator has a plurality of air bearings for holding the rotor in a non-contacting manner. Also, the stator has a plurality of turbine nozzles mounted radially around the impeller to blow jet streams of gas against the impeller. In the spinners disclosed in JP-A-2001-141800 and JP-A-2003-177172, the turbine nozzles are simple holes extending straight. In such a spinner, a gas chamber is formed around the turbine nozzles to feed gas into the nozzles. The gas chamber assumes a simple annular form. The turbine nozzles are connected to the gas chamber perpendicularly or nearly perpendicularly.

The spinner disclosed in U.S. Pat. No. 5,202,633 has a plurality of turbine nozzles each having a linear shape. The cross-sectional area of each turbine nozzle continuously decreases along the direction of flow of gas. The gas chamber formed around the turbine nozzles is formed as a simple annular cavity. FIG. 5 of U.S. Pat. No. 5,202,633 shows tilted turbine nozzles that create oblique jet streams.

In order to perform high-resolution measurements, it is necessary to increase the spinning rate of the sample tube as high as possible. That is, the speed or power of jet streams needs to be increased to a maximum. However, when gas is admitted into the spinner, if the gas pressure is simply increased, and if the flow of the gas inside the spinner is disturbed hydrodynamically, e.g., contracted flow and peeling occur, the pressure loss will increase. As a result, it would be difficult to increase the spinning rate of the sample tube.

It can be said that sufficient structural consideration has not been given to reduce the pressure loss throughout the gas channel of the conventional spinner including the gas chamber and turbine nozzles. Consequently, it has been difficult to increase the upper limit of the spinning rate.

SUMMARY OF THE INVENTION

It is an object of the present invention to provide an NMR spinner having a rotor that can be spun at high speed. More specifically, it is an object of the invention to provide an NMR spinner in which the flow rate is suppressed in a first portion of the spinner where disturbances such as contracted flow and peeling tend to be produced and in which the flow rate can be increased sufficiently in a downstream second portion while suppressing such disturbances.

An NMR spinner associated with the present invention has: a rotor including a sample-holding portion for holding a sample to be investigated by NMR spectroscopy and an impeller being rotated by being subjected to jet streams of gas; and an outer subassembly mounted around the rotor and including a chamber and a plurality of curved nozzles mounted inside the chamber. The chamber creates a rotating flow of gas in response to gas introduced from the outside. The curved nozzles create inwardly swirling streams continuous with the rotating flow. The inwardly swirling streams are ejected from the nozzles, thus producing the jet streams.

The outer subassembly forms a stator in contrast to the rotor. The outer subassembly has an outer portion provided with the chamber that produces the rotating flow around the rotor. The rotating flow fundamentally rotates in the same direction as the rotor. On the other hand, inside the outer subassembly, the curved nozzles producing the inwardly swirling streams are mounted. Preferably, the inwardly swirling streams are produced from inside the rotating flow and form extensions to the rotating flow or branching streams of the rotating flow such that these inwardly swirling streams engulf the rotor along the direction of rotation. The inwardly swirling streams produce jet streams. In this configuration, when gas is forced from the chamber into the curved nozzles, natural streams, i.e., having no or less disturbances, can be generated. Also, natural streams can be generated in the curved nozzles and, therefore, the pressure loss occurring in the process of circulation of gas can be made much less than conventional. This makes it possible to increase the speed or power of the jet streams. As a consequence, the spinning rate of the rotor can be improved.

In the entrance to the chamber and in the portion immediately ahead of the entrance (i.e., gas introduction portion), bending of the flow path and large variations in cross-sectional area tend to occur. If the pressure of the introduced gas is increased injudiciously in spite of these facts, the flow rate in the gas introduction portion will increase but contracted flow and peeling occur, increasing the pressure loss. As a result, it will be difficult to obtain expected results.

In contrast, with the above-described configuration according to the present invention, streams involving no or little disturbances can be created after the introduction of the gas into the chamber. Therefore, in this process, the flow rate can be increased sufficiently. Concomitantly, the flow rate in the gas introduction portion does not need to be increased excessively. That is, undesirable phenomena such as contracted flow and peeling can be prevented or suppressed by suppressing the flow rate in the gas introduction portion. In this way, the speed or power of the jet streams can be increased sufficiently. Of course, after the gas channel is so designed as to reduce disturbances in the flow in the gas introduction portion, the flow rate in the gas introduction portion may be increased. In this configuration, the spinning rate of the rotor can be increased further.

It is desired to secure a sufficiently high flow rate in the gas introduction portion by sufficiently increasing the cross-sectional area at the end of the gas introduction portion while suppressing the flow rate in the gas introduction portion. The above-described spinner is fundamentally used in solid-state NMR measurements. Where plural impellers are mounted at plural positions on the rotor and driven, outer subassemblies of the above-described construction may be mounted at plural locations.

Preferably, the inwardly swirling streams are curved streams smoothly continuous with the inside of the rotating flow. In each curved nozzle, the area of the cross section perpendicular to the direction of flow of the gas decreases continuously from its entrance to its exit and the degree of curvature increases continuously. In this configuration, the inwardly swirling streams are smoothly continuous with the inside of the rotating flow and so the pressure loss occurring when gas is introduced into the curved nozzles can be reduced. Furthermore, the cross section of each curved nozzle decreases continuously along the direction of the flow and, therefore, the flow rate can be increased while preventing disturbances. Examples of the fundamental form of the curved nozzles include a logarithmic spiral, an involute curve, and other vortex-like forms. The aforementioned continual variation in cross section is produced across the main portions of the flow channel from the entrances of the nozzles to the exits of the nozzles. For example, a part of the flow channel may contain a constant cross-sectional area. In any case, the interior of each curved nozzle is preferably smoothed to prevent rapid variations in cross section or large steps.

Preferably, the area of the cross section in the chamber which is perpendicular to the direction of flow of the gas decreases continuously in an upstream to downstream direction. In this configuration, the flow rate in the chamber can be increased continuously. The sizes and shapes of the curved nozzles may be adjusted to make uniform the jet streams according to the need. The cross-sectional area of the chamber may be varied continuously over an angular range of 360° from the position at which gas is introduced. In its main portions, the cross-sectional area may be varied continuously. The cross section is preferably smooth along the direction of the flow in the chamber such that neither steep variations in cross-sectional area nor large steps occur.

Preferably, the outer surface of the chamber is spiral, i.e., vortical. It can assume various shapes drawn by a continuously decreasing radius. Especially, the use of a logarithmic spiral form is desirable. Preferably, the plural nozzle entrances of the curved nozzles are formed on the inner surface of the chamber at regular intervals.

Preferably, the cross-sectional area of the chamber at the gas inlet positions is twice or more as large as the total cross-sectional area of the nozzle exits of the curved nozzles. Depending on various conditions, in order to sufficiently increase the speed or power of the jet streams while suppressing the flow rate in the gas introduction portion, it is generally desired that the area of the cross section of the chamber perpendicular to the direction of flow in the gas inlet positions be twice or more the total cross-sectional area of the nozzle exits.

Preferably, the outer subassembly includes a first component having a grooved structure conforming with the chamber and the curved nozzles and a second component coupled to the first component and providing a cover over the grooves. With this configuration, the chamber and curved nozzles can be formed by forming the grooved structure by cutting the first component and bonding the second component to the first component.

According to the present invention, it is possible to offer a spinner whose rotor can be spun at high speed during NMR measurements. According to the invention, it is also possible to offer a spinner having upstream portions where contracted flow and peeling easily occur and where the flow rate is suppressed and downstream portions where the gas flow rate can be sufficiently increased while suppressing contracted flow and peeling to a minimum.

DESCRIPTION OF THE INVENTION

The preferred embodiments of the present invention are hereinafter described with reference to the drawings.

Figure 1:
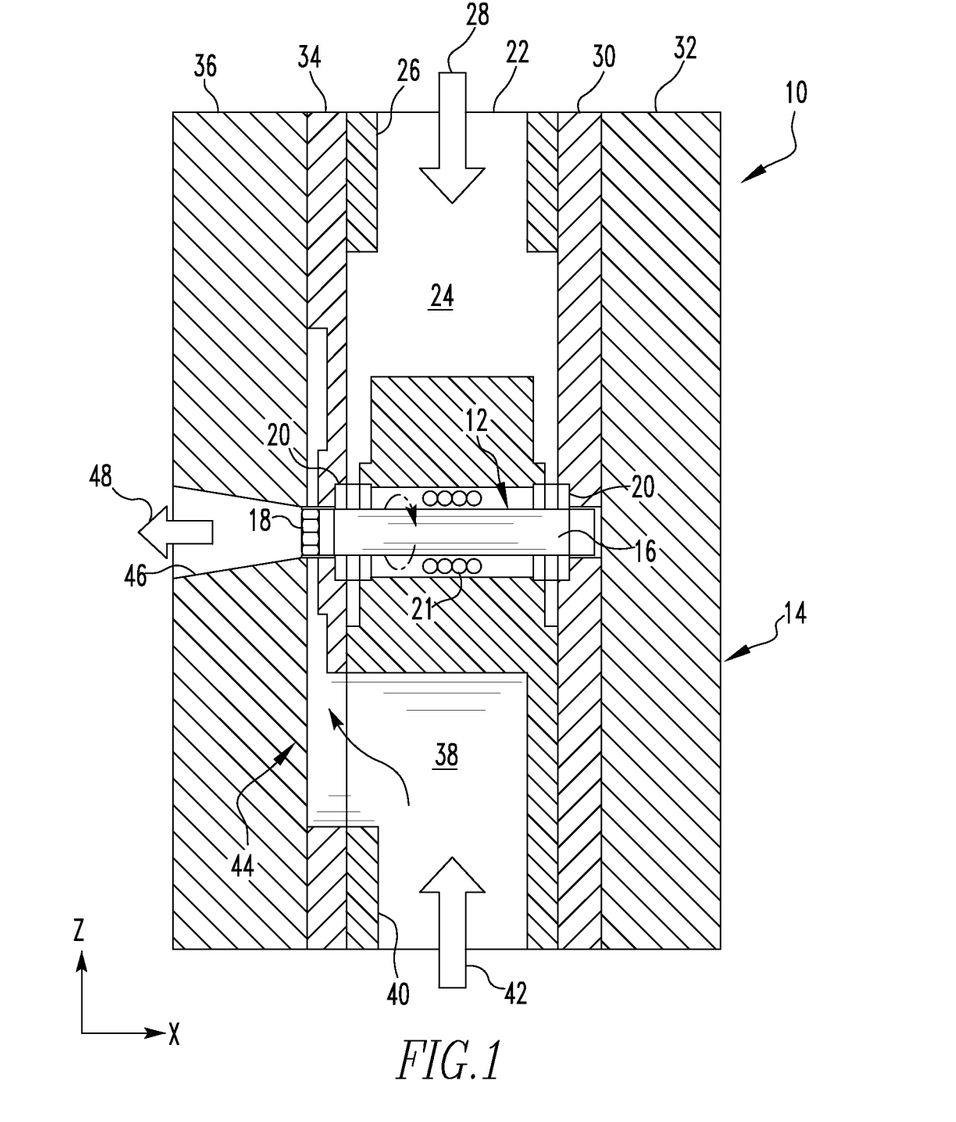
FIG. 1 is a cross-sectional view of an NMR spinner according to one preferred embodiment of the present invention.

In the cross section of FIG. 1, there is shown an NMR spinner according to one preferred embodiment of the present invention, the spinner being a mechanism for spinning a sample tube.

In FIG. 1, the spinner is generally indicated by reference numeral 10, and is a part of an NMR probe. A static magnetic field generator 50 (FIG. 2) has a bore in which the spinner 10 is disposed. Under this condition, the spinner 10 spins a rotor 12 at high speed. The rotor 12 is a cylindrical sample tube holding a solid sample therein. The rotor 12 consists of a sample-holding portion 16 and an impeller (turbine) 18. Generally, the rotor 12 has a diameter of several millimeters to tens of millimeters. In the present embodiment, however, the diameter is 0.75 mm. That is, a quite thin sample tube is used to achieve high-speed spinning. It is to be noted that numerical values set forth in the present specification are merely exemplary. It is possible to form impellers at both ends of the rotor, in which case two turbine nozzles are mounted in a corresponding manner to the two impellers. The spinner 10 is cooled according to the need.

An outer subassembly 14 surrounds the rotor 12 and forms a stator. A cavity for accommodating the rotor is formed in the outer subassembly 14. In the cavity, a plurality of air bearings 20 are formed at intervals along the central axis of rotation and hold the rotor 12 in a non-contacting manner. Gas 28 introduced from gas inlet ports 26 is supplied into the air bearings 20 via a gas passage 24. A transmit/receive coil 21 is disposed in the cavity and surrounds the sample-holding portion 16 of the rotor. When the rotor 12 is spinning at high speed, an RF magnetic field is produced by the transmit/receive coil 21. During a subsequent reception period, the resulting NMR signal is detected by the transmit/receive coil 21. An optical spectrum is obtained by analyzing the signal. When such a solid sample is investigated by NMR spectroscopy, the central axis of rotation of the rotor 12 is tilted at the magic angle (arccos $\sqrt{(1/3)}$) with respect to the direction of the static magnetic field. The rotor 12 is driven while maintaining the angle. In FIG. 1, the X-direction is parallel to the central axis of rotation. The Z-direction is perpendicular to the X-direction. The direction perpendicular to both X-direction and Y-direction is the Y-direction shown in FIG. 3 and other figure.

In the present embodiment, the outer subassembly 14 consists of a plurality of laminate members 22, 30, 32, 34, and 36 stacked on top of each other in the X-direction. The laminate members are made of a material that does not affect NMR measurements, i.e., ceramics, resins, and composite materials. The laminate member 22 forms the body of the outer subassembly 14. The gas passage 24 for air bearings and gas inlet ports 26 are formed in this laminate member 22 in an upper part of the outer subassembly 14 as shown in FIG. 1. The laminate member 22 is also provided with gas inlet ports 40 for introducing gas 42 for driving the turbine. An introduction channel 38 continuous with the inlet ports 40 is also formed in this laminate member 22 in a lower part of the outer subassembly 14 as shown in FIG. 1. The introduction channel 38 consists of a first component 34 parallel to the Z-direction and a second component 36 that is parallel to the X-direction and continuous with the first component. The whole introduction channel 38 forms a bent channel. The first and second components are cylindrical in shape and have large cross sections at positions taken along the direction of flow. The aforementioned gas is air or an inert gas (such as nitrogen or helium).

The plate-like laminate members 30 and 32 are mounted on one side of the body 22 of the outer subassembly 14 as viewed along the X-axis. The plate-like laminate members 34 and 36 are mounted on the other side of the body 22 as viewed along the X-axis. That is, the outer subassembly 14 is a laminate body. The plate-like laminate member 34 extends along the Y-Z plane. A vortical channel 44 (described in detail later) is formed in the plate-like member 34. The gas 42 is fed into the vortical channel 44 via the gas inlet ports 40. The vortical channel 44 is fabricated by cutting the plate-like member 34. When the outer subassembly 14 is assembled, the laminate member 36 is bonded to the plate-like member 34. Consequently, the open side of the grooved structure is fully covered by the plate-like laminate member 36. The plate-like member 36 is provided with a discharge port 46 spreading like a horn from the deeper side to the exit side. Gas 48 produced after blowing jet streams against the impeller 18 is discharged from the discharge port 46.

Figure 2:
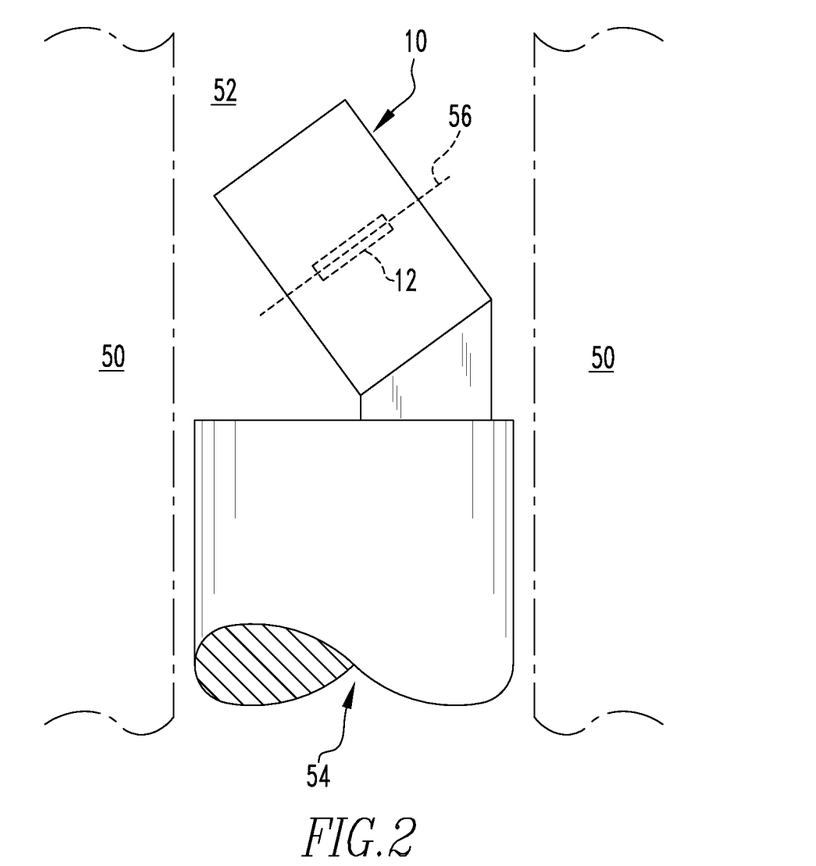
FIG. 2 is a schematic representation showing the state in which the NMR spinner shown in FIG. 1 is installed in a static magnetic field generator.
Figure 3:
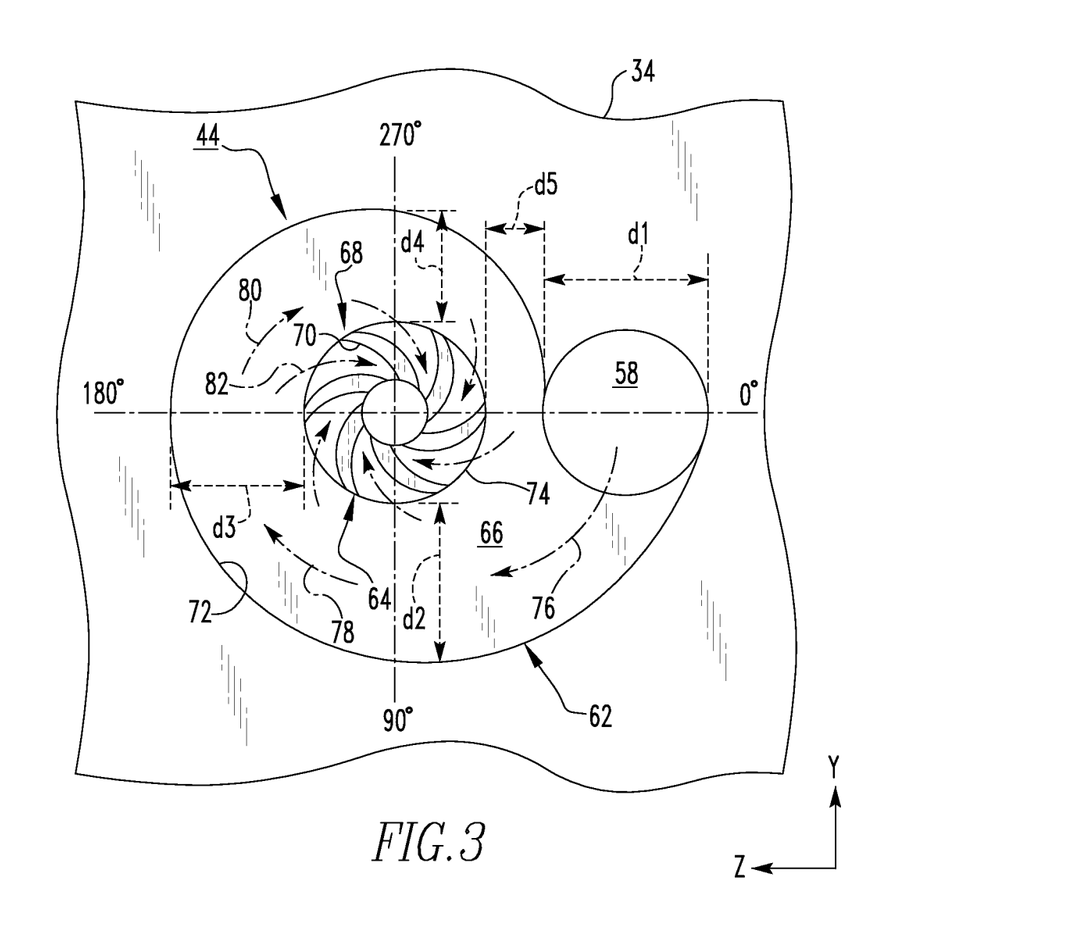
FIG. 3 is a plan view of a vortical channel included in the NMR spinner shown in FIG. 1.

FIG. 2 shows one example of installation of the spinner 10. The spinner 10 is disposed in a bore 52 formed in the static magnetic field generator 50. In particular, the spinner 10 forms the head of an NMR probe 54. The spinner 10 is installed such that the central axis of rotation 56 of the rotor 12 is tilted at the given magic angle to the direction of the static magnetic field (up-down direction as viewed in the plane of the paper). Piping (not shown in FIG. 2) is connected to the spinner 10 to feed gas into it.

FIG. 3 is a plan view of the vortical channel 44. In FIG. 1, the introduction channel is shown to appear below the cavity in which the rotor 12 is received. In FIG. 3, for the sake of illustration, a gas inlet port 58 corresponding to the end surface of the introduction channel is shown to appear to the right of the cavity that is the central opening in the vortical channel 44. In FIG. 3, the deep side of the paper is the positive direction of the X-axis.

In FIG. 3, the plate-like laminate member 34 is provided with the vortical channel 44. The vortical channel 44 is formed around the rotor and composed of an outer member 62 and an inner member 64 that is surrounded by the outer member 62. The outer member 62 has the circular gas inlet port 58 and a chamber 66 that is a space in communication with the inlet port 58. The inner member 64 has a nozzle array 68 formed by nozzles 70 having a vortical array. When gas is introduced from the gas inlet port 58 into the chamber 66, a rotating flow is created as indicated by arrows 76, 78, and 80. The direction of rotation of the rotating flow is coincident with the direction of spinning of the rotor. Parts of the rotating flow gush into the nozzles 70 from inside of the rotating flow, thus producing inwardly swirling streams (nozzle streams) that are branching streams or extension streams. The rotor is involved in the inwardly swirling streams along the direction of the rotation. The inwardly swirling streams are smoothly continuous with the rotating flow. The outer rotating flow and the inner inwardly swirling streams together constitute a vortical flow.

The outer member 62 is described in further detail. In the present embodiment, the outer surface 72 of the chamber 66 assumes a logarithmic helical form in the Y-Z plane. The inner surface 74 of the chamber is circular. Plural nozzle entrances (described later) are formed on the inner surface 74 at regular intervals. The width of the chamber 66 that is perpendicular to the direction of flow of the gas (centerline) as viewed along the Y-Z plane decreases continuously in an upstream to downstream direction.

For the sake of illustration, the gas inlet port 58 is assumed to lie in an orientation of 0 degrees relative to the center of the cavity. An angle of 360 degrees is defined from this orientation in the direction of flow of the gas, i.e., in a clockwise direction. The width of the chamber 66 is greatest in an orientation of 0 degrees and corresponds to the sum of the diameter $d1$ of the gas inlet port 58 and the gap $d5$. In an orientation of 90 degrees, the width is $d2$. In an orientation of 180 degrees, the width is $d3$. In an orientation of 270 degrees, the width is $d4$. A relation, $d2>d3>d4>d5$, holds. The gap $d5$ can be reduced further (even down to substantially zero). In order to secure sufficiently high flow rate in the gas introduction portion even if the flow rate is lowered, it is desired to set the diameter $d1$ to a large value. Conditions about the diameter $d1$ are described later. The width, i.e., cross-sectional area, of the chamber 66 decreases continuously along the direction of the flow of the gas. It follows that the flow rate increases in an upstream to downstream direction. Any structure disturbing the flow does not exist in the chamber 66. Hence, contracted flow and peeling can be suppressed effectively. In the present embodiment, the thickness of the chamber 66 taken along the X-axis is constant. This will be described later in connection with FIG. 7.

Figure 4:
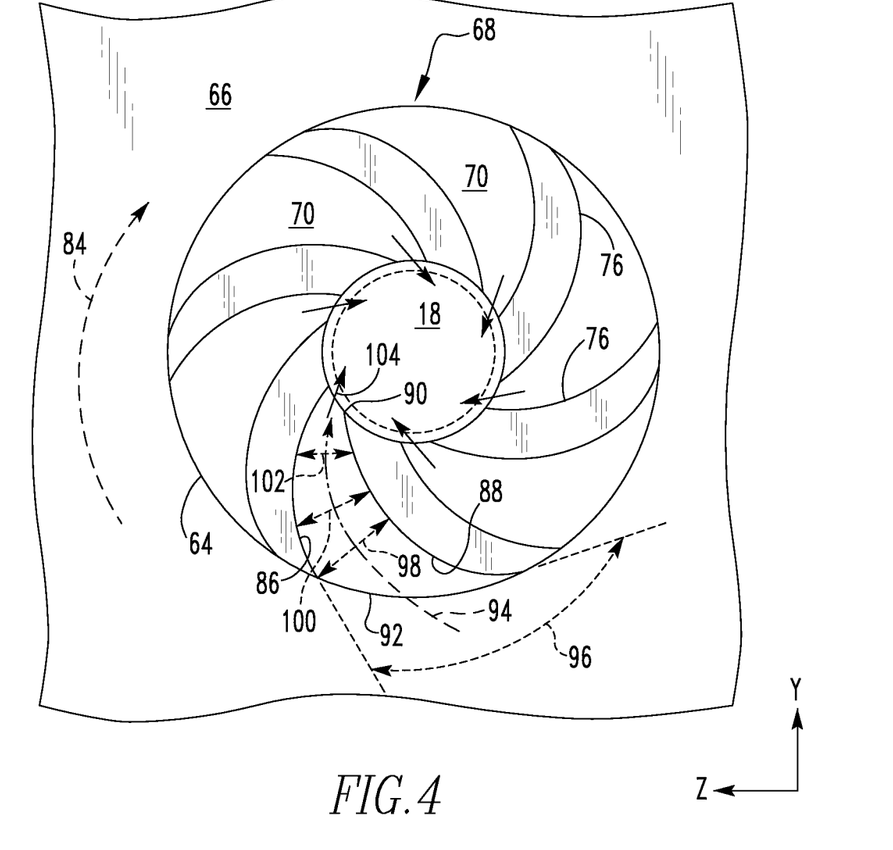
FIG. 4 is an enlarged view of a nozzle array included in the vortical channel shown in FIG. 3.

FIG. 4 is an enlarged view of the inner member 64 (especially, the nozzle array 68) shown in FIG. 3. The nozzle array 68 is formed inside the chamber 66, and consists of the nozzles (turbine nozzles) 70. In the example shown in FIG. 4, six nozzles 70 are formed. Generally, the appropriate number of nozzles is from 4 to 20 inclusive. Note that these numerical values are merely exemplary. Each nozzle 70 takes in a part of a rotating flow 84 and produces inwardly swirling streams 94. The direction of rotation of each inwardly swirling stream 94 is coincident with the direction of rotation of the rotor and the rotating flow. Curved partition walls 76 are formed between any adjacent two of the nozzles 70. The inner surface of each nozzle 70 has a smoothly concavely curved first guide surface 86 and a smoothly convexly curved second guide surface 88, as well as end surfaces as viewed along the X-axis. These end surfaces form a bottom surface and a top surface, respectively. In the present embodiment, the bottom surface is a flat surface, and the top surface is formed by the front surface of each member that covers the corresponding vortical channel.

The top surface is also a flat surface. Therefore, in each nozzle 70, the cross section perpendicular to the central axis of the curved flow is fundamentally rectangular at any position. The cross section may assume a nonrectangular form. Also, the bottom surface may also be formed to include a tilted surface as described later in connection with FIG. 8.

The cross-sectional area of each nozzle 70 decreases continuously from its entrance 92 to its exit 90 as indicated by arrows 98, 100, and 102. Consequently, the flow rate is increased continuously through each nozzle 70. The position and form of the nozzle exit 90 are so determined that jet streams 104 are formed at given positions in a given direction. The plural jet streams are blown against the blades of the impeller 18. This creates a propelling force that drives the rotor. Various designs can be adopted as the structure of the impeller. The nozzle entrance 92 is spread greatly circumferentially as indicated by arrows 96 to permit the gas to be accepted naturally from the rotating flow. The inner member 64 shown in FIG. 4 is only one example. The nozzle array 68 and the nozzles 70 can be designed variously. In any case, it is desired that nozzle streams smoothly continuous from the rotating flow be created. Preferably, the streams in each nozzle are not disturbed.

Figure 5:
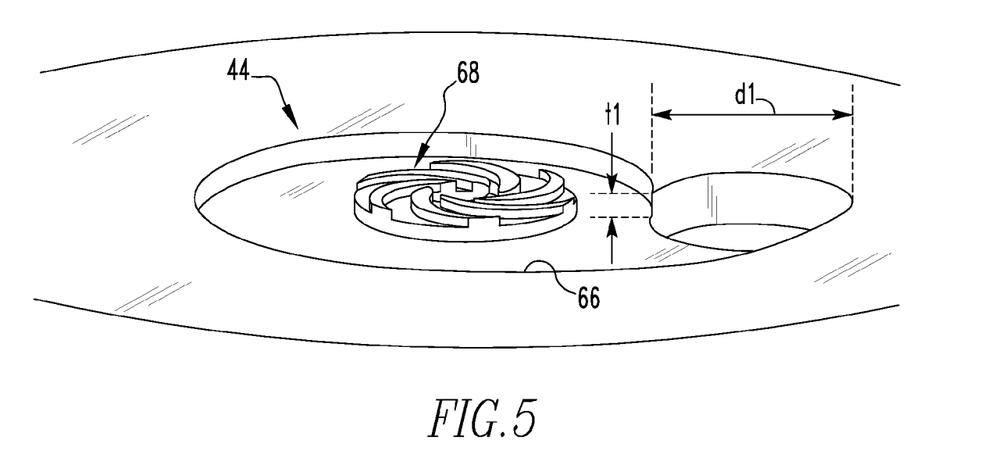
FIG. 5 is a perspective view of the vortical channel shown in FIG. 3.

FIG. 5 is a perspective view of the vortical channel 44. As described previously, the vortical channel 44 has the chamber 66 producing the rotating flow on the outer side and the nozzle array 68 producing the inwardly swirling streams on the inner side. In designing the vortical channel 44, the cross-sectional area A1 (the cross-sectional area of the entrance of the vortical channel 44) corresponding to the entrance of the chamber 66 is preferably twice or more the total A2 of the cross-sectional areas (the cross-sectional area of the exit of the vortical channel 44) of the nozzle exits from an aerodynamic point of view. In this case, the cross-sectional area A1 of the entrance is defined to be the diameter d1 of the circular gas inlet port multiplied by the thickness t1 of the chamber 66. Preferably, the gas introduction portion located upstream of the gas inlet port has a cross-sectional area that is considerably larger than the cross-sectional area A1 of the entrance. In this configuration, if there is a bent channel or a large variation in cross-sectional area inside the gas introduction portion, the flow rate is reduced at this location. Therefore, occurrence of contracted flow or peeling can be prevented or suppressed. In this way, the gas introduced as a relatively slow-speed flow is accelerated in the chamber 66 and in the nozzles, whereby a high-speed flow is created. The high-speed flow is ejected from the exits of the nozzles, producing high-speed jet streams.

Figure 6:
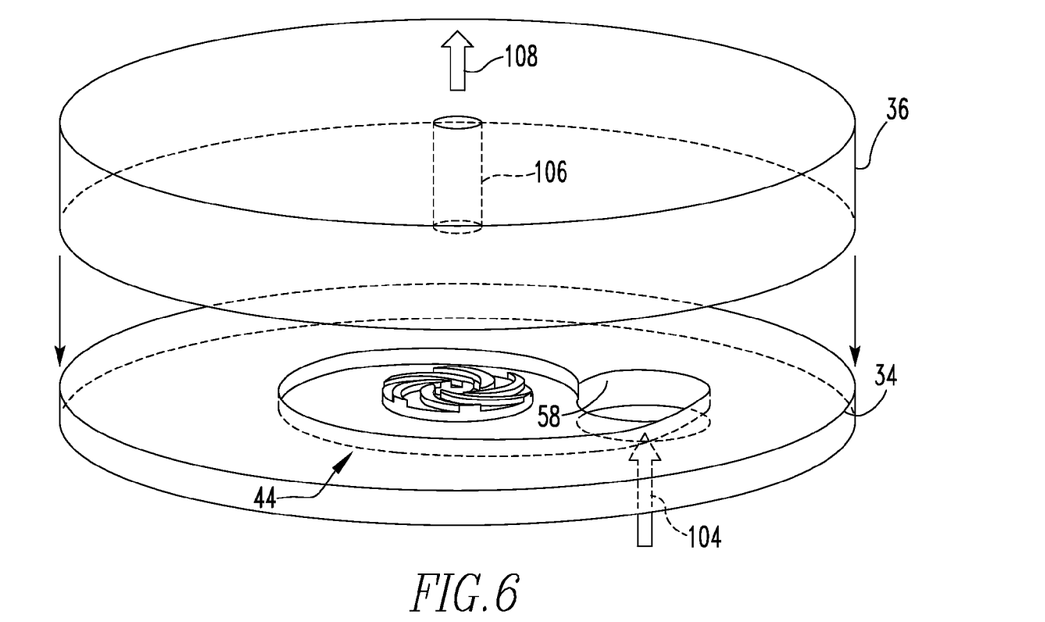
FIG. 6 is an exploded perspective view of the vortical channel shown in FIG. 5, illustrating the manner in which the vortical channel is formed by bonding together two members.

FIG. 6 illustrates the process of fabricating the vortical channel 44. A grooved structure is formed as the main portion of the vortical channel 44 by cutting the circular plate-like member 34. The plate-like member 34 is also provided with the circular gas inlet port 58 that accepts gas 104. On the other hand, the circular plate-like member 36 is provided with the cylindrical discharge port 106 that acts to discharge the gas 108 after it is blown against the impeller. The two plate-like members 34 and 36 which have been processed in a given manner are bonded together as shown. Consequently, the open surface of the grooved structure is covered by one surface of the plate-like member 34. Thus, the vortical channel 44 is completed.

Figure 7:
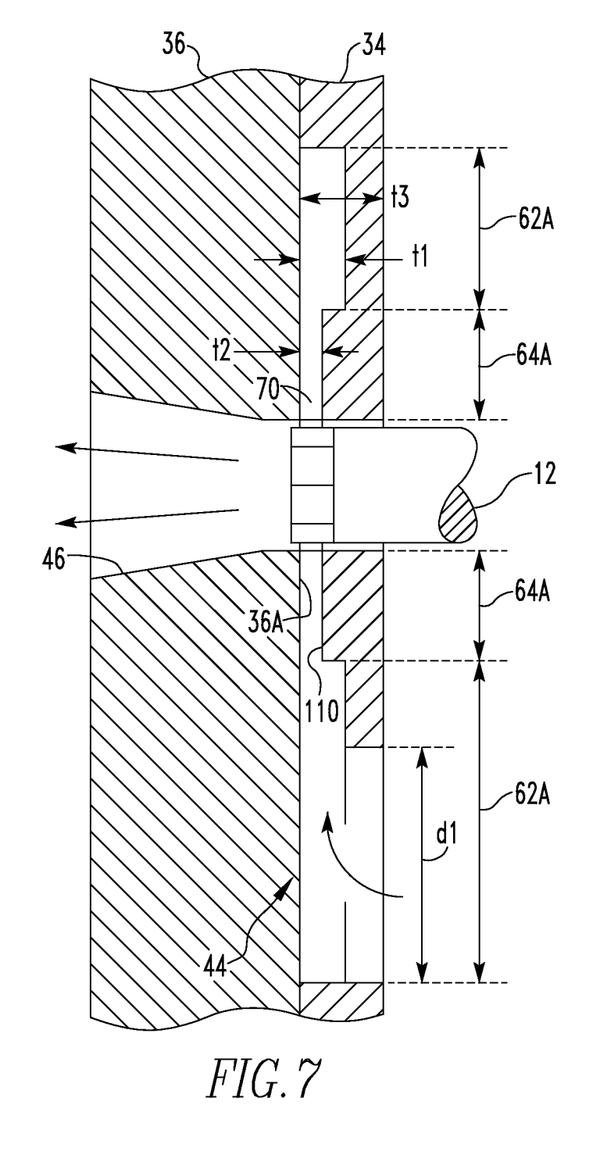
FIG. 7 is a fragmentary enlarged view of the NMR spinner shown in FIG. 1.

FIG. 7 is an enlarged view of a part of the spinner shown in FIG. 1, showing a cross section of the vortical channel 44. The vortical channel 44 is a part of a structural body fabricated around the rotor. The vortical channel 44 consists of an outer member 62A and an inner member 64A. The aforementioned laminate member 34 has a constant thickness of t3. The chamber included in the outer member has a constant thickness of t1. The nozzles 70 included in the inner member have a constant thickness of t2. In the present embodiment, the relation t1>t2 is set for the convenience of processing. The difference between the thicknesses t1 and t2 is small and so disturbance of the flow at the step portion is considerably small. Of course, the thickness t1 of the chamber may be made equal to the thickness t2 of the nozzles. In FIG. 7, the cross section of the chamber perpendicular to the direction of flow is rectangular. Alternatively, the cross section may assume an elliptical or other form. Similarly, the cross section of each nozzle perpendicular to the direction of flow is rectangular. This cross section may be elliptical. The bottom surface of the nozzle at the right side of FIG. 7 may be curved, and the top surface of the nozzle at the left side of FIG. 7 may be a flat surface.

Figure 8:
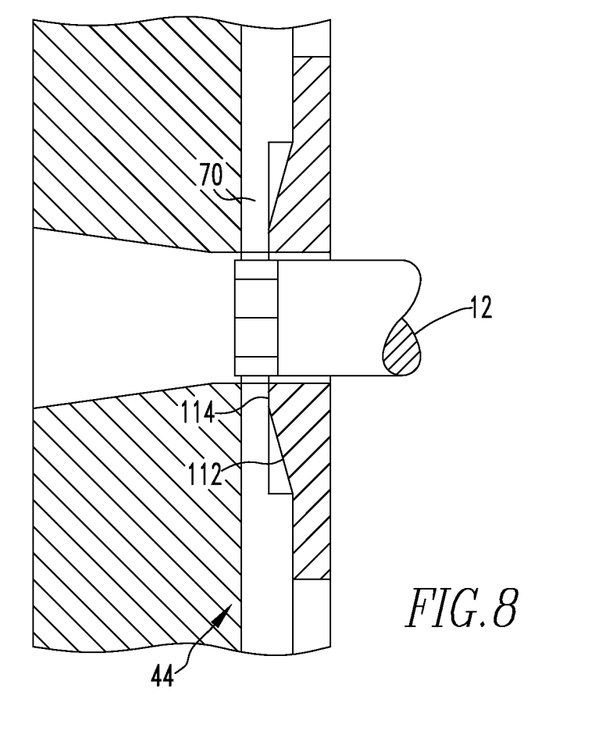
FIG. 8 is an enlarged view of a modification of the NMR spinner shown in FIG. 7.

FIG. 8 shows a modification of the nozzle 70. In this example, the bottom surface of the nozzle 70 is composed of an inclined surface 112 and a horizontal surface 114. The inclined surface 112 continuously varies the distance between the bottom and top surfaces, from the thickness of the chamber to the thickness of the nozzle exit. The horizontal surface 114 acts to form stable jet streams at the nozzle exits such that the streams are directed in appropriate directions.

Figure 9:
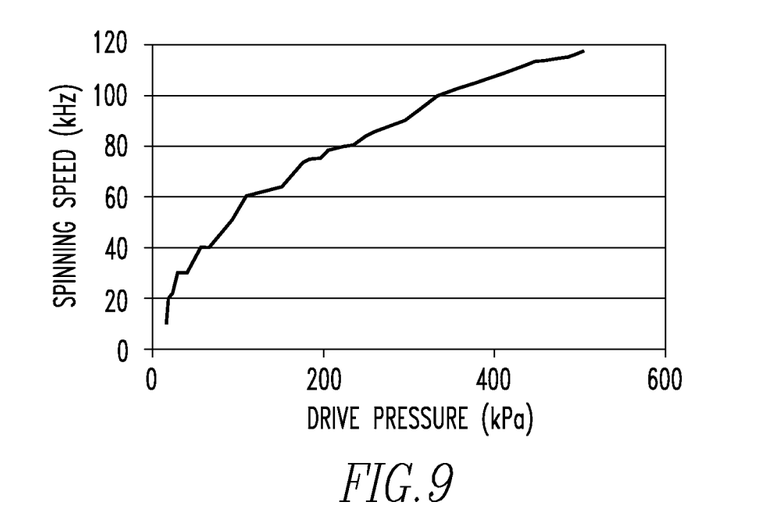
FIG. 9 is a graph showing the relation between the gas pressure and the spinning rate of the rotor of the NMR spinner shown in FIG. 1.

The performance of the vortical channel associated with the present embodiment is graphed in FIG. 9. The performance was measured under conditions where the diameter of the sample tube was 0.75 mm, the number of the nozzles was four, the cross-sectional area A1 of the entrance of the vortical channel was 2.5 times as large as the cross-sectional area A2 of the exit of the vortical channel (A1/A2=2.5), and the cross section of each nozzle was rectangular in shape as described previously. In the graph, the horizontal axis indicates the pressure of the gas for driving the spinner, and the vertical axis indicates the rotational speed (spinning speed). As shown in the graph, the maximum rotational frequency was 117 kHz, which is converted into a spinning speed of 275 m/s. The upper limit achieved heretofore under similar conditions was approximately 240 to 270 m/s. As can be seen by a comparison, the vortical channel of the present embodiment can increase the upper limit of the spinning speed reliably. This experimental result is merely one example. It can be expected that the spinning rate will be improved further by more streamlining the shapes of the various parts of the vortical channel so as to increase the ratio A1/A2.

The vortical channel can assume various forms. In the above embodiment, the cross-sectional area of the chamber continuously decreases in an upstream to downstream direction. As long as the flow rate can be enhanced sufficiently, the cross-sectional area can be kept constant. Furthermore, in the above embodiment, the cross-sectional area of each nozzle decreases continuously in an upstream to downstream direction. The cross-sectional area can be kept constant as long as necessary jet streams can be created. In any case, a plurality of inwardly swirling streams are preferably created smoothly from inside of a rotating flow.

Having thus described my invention with the detail and particularity required by the Patent Laws, what is desired protected by Letters Patent is set forth in the following claims.

The invention claimed is:

1. An NMR spinner comprising:
   a rotor (12) including a sample-holding portion (16) for holding a sample to be investigated by NMR spectroscopy and an impeller (18) being rotated by being subjected to jet streams of gas; and
   an outer subassembly mounted around the rotor and including a chamber (66) and a plurality of curved nozzles (70) mounted inside the chamber, said nozzles having an entrance from the chamber and an exit directed at the impeller, the chamber acting to create a rotating flow of gas in response to gas introduced from the outside, the curved nozzles acting to create inwardly swirling streams continuous with the rotating flow,
   wherein the inwardly swirling streams are ejected from the nozzles, thus creating the jet streams.

2. The NMR spinner as set forth in claim 1, wherein said inwardly swirling streams are curved streams smoothly continuous with the inside of the rotating flow, and wherein each of said curved nozzles has a cross section which is perpendicular to the direction of the flow of said gas and whose area decreases continuously from the entrance to the exit of the nozzle, the cross section having a degree of curvature increasing continuously.

3. The NMR spinner as set forth in claim 1, wherein said chamber has a cross section which is perpendicular to the direction of flow of said gas and whose area decreases continuously in an upstream to downstream direction.

4. The NMR spinner as set forth in claim 3, wherein said chamber has a spiral outer surface.

5. The NMR spinner as set forth in claim 4, wherein said curved nozzles have nozzle entrances which are formed at regular intervals on an inner surface of said chamber.

6. The NMR spinner as set forth in claim 1, wherein said chamber has a cross-sectional area at a position where the gas is introduced, and wherein this cross-sectional area is twice or more as large as the total cross-sectional area of the nozzle exits of said curved nozzles.

7. The NMR spinner as set forth in claim 1, wherein said outer subassembly includes:
   a first component having said chamber and a grooved structure conforming with said curved nozzles; and
   a second component coupled to the first component and covering the grooved structure.

* * * * *